United States Patent
Park et al.

(10) Patent No.: US 9,543,476 B2
(45) Date of Patent: Jan. 10, 2017

(54) UV LIGHT EMITTING DIODE AND METHOD OF FABRICATING THE SAME

(71) Applicant: Seoul Viosys Co., Ltd., Ansan-si (KR)

(72) Inventors: Ki Yon Park, Ansan-si (KR); Jeong Hun Heo, Ansan-si (KR); Hwa Mok Kim, Ansan-si (KR); Chang Suk Han, Ansan-si (KR); Hyo Shik Choi, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 14/556,033

(22) Filed: Nov. 28, 2014

(65) Prior Publication Data
US 2015/0144874 A1 May 28, 2015

(30) Foreign Application Priority Data
Nov. 27, 2013 (KR) .................. 10-2013-0145122

(51) Int. Cl.
*H01L 33/06* (2010.01)
*H01L 33/32* (2010.01)

(52) U.S. Cl.
CPC .............. *H01L 33/32* (2013.01); *H01L 33/06* (2013.01)

(58) Field of Classification Search
CPC ...... H01L 33/0025; H01L 33/06; H01L 33/32; H01L 33/00; H01L 33/02; H01L 33/04; H01L 33/12
See application file for complete search history.

(56) References Cited

U.S. PATENT DOCUMENTS

| | | | |
|---|---|---|---|
| 2004/0072383 A1* | 4/2004 | Nagahama et al. | 438/47 |
| 2008/0315180 A1* | 12/2008 | Kim et al. | 257/13 |
| 2009/0224226 A1* | 9/2009 | Huang | H01L 33/06 257/13 |
| 2011/0095263 A1* | 4/2011 | Son | 257/13 |
| 2012/0145993 A1* | 6/2012 | Na et al. | 257/13 |
| 2013/0075695 A1* | 3/2013 | Son | 257/13 |
| 2013/0082237 A1* | 4/2013 | Northrup et al. | 257/13 |
| 2013/0228743 A1* | 9/2013 | Fu et al. | 257/13 |
| 2014/0374771 A1* | 12/2014 | Umeno et al. | 257/76 |
| 2015/0083994 A1* | 3/2015 | Jain et al. | 257/13 |

* cited by examiner

*Primary Examiner* — Fazli Erdem
(74) *Attorney, Agent, or Firm* — Perkins Coie LLP

(57) ABSTRACT

A UV light emitting diode and a method of fabricating the same are provided. The light emitting diode includes an active area between an n-type nitride-based semiconductor layer and a p-type nitride-based semiconductor layer, wherein the active area includes a plurality of barrier layers containing Al, a plurality of well layers containing Al and alternately arranged with the barrier layer, and at least one conditioning layer. Each conditioning layer is placed between the well layer and the barrier layer adjacent to the well layer and is formed of a binary nitride semiconductor. The design of the conditioning layer can reduce stress of the active area while allowing uniform control of the composition of the well layers and/or the barrier layers.

18 Claims, 6 Drawing Sheets

UV LIGHT EMITTING DIODE AND METHOD OF FABRICATING THE SAME

CROSS-REFERENCE TO RELATED APPLICATION

This patent document claims priority from and the benefits of Korean Patent Application No. 10-2013-0145122, filed on Nov. 27, 2013, the entirety of which is hereby incorporated by reference.

TECHNICAL FIELD

The technology disclosed in this patent document relates to an inorganic semiconductor light emitting diode, including a nitride-based ultraviolet (UV) light emitting diode and a method of fabricating the same.

BACKGROUND

Generally, a light emitting diode emitting UV light in a wavelength range of 200 nm to 365 nm may be used for various applications including a sterilization apparatus or an excitation source of a bio-aerosol fluorescent detection system.

A nitride-based light emitting diode capable of emitting UV light is typically grown on a growth substrate such as a sapphire substrate or an aluminum nitride substrate. In addition, fabrication of vertical type UV light emitting diodes is possible, e.g., examples disclosed in a published PCT application No. WO2008/054995 entitled "VERTICAL DEEP ULTRAVIOLET LIGHT EMITTING DIODES" in PCT application No. PCT/US2007/081634.

SUMMARY

Examples of implementations of the disclosed technology include inorganic semiconductor light emitting diodes with improved crystal structures and stable electrical and optical properties in addition to methods of fabricating the inorganic semiconductor light emitting diodes with the described structure and properties. The disclosed examples of the inorganic semiconductor light emitting diodes include a gallium nitride-based UV light emitting diode, which can prevent generation of crystal defects such as cracks.

The disclosed examples of the inorganic semiconductor light emitting diodes include a light emitting diode, which allows uniform control of compositions of well layers and/or barrier layers.

The disclosed examples of the inorganic semiconductor light emitting diodes include a UV light emitting diode, which exhibits uniform electrical and optical characteristics In one aspect of the disclosed technology, a UV light emitting diode includes: an active area disposed between an n-type nitride-based semiconductor layer and a p-type nitride-based semiconductor layer. The active area includes a plurality of barrier layers containing Al and a plurality of well layers containing Al. The well layers and the barrier layers are disposed over each other in an alternating arrangement. The active layer also includes a conditioning layer disposed between one of the well layers and one of the barrier layers. The conditioning layer is placed between the well layer and the barrier layer adjacent to the well layer and is formed of a nitride semiconductor.

The design of the conditioning layer can reduce stress of the active area while allowing uniform control of the composition of the well layers and/or the barrier layers.

The UV light emitting diode can be implemented in various ways to include one or more of the following features. The conditioning layer can include a nitride semiconductor may include GaN or AlN. Particularly, AlN has a wider band-gap than the well layer and thus does not absorb light generated from the well layer to reduce light loss. The nitride semiconductor can include a binary nitride semiconductor. The at least one conditioning layer may include a well-conditioning layer adjoining the corresponding one of the well layers at a side of the n-type nitride-based semiconductor layer. The UV light emitting diode according to claim 1, wherein the conditioning layer comprises a well-conditioning layer adjoining the corresponding one of the well layers at a side of the n-type nitride-based semiconductor layer. The corresponding one of the barrier layers adjoining the well-conditioning layer is an inclined-composition layer having an Al content increasing towards the well-conditioning layer. The at least one conditioning layer may include a barrier-conditioning layer adjoining the corresponding one of the barrier layers at a side of the n-type nitride-based semiconductor layer. The at least one conditioning layer may include both the well-conditioning layer and the barrier-conditioning layer. The barrier layers may have a constant composition, without being limited thereto. Alternatively, the barrier layers may have a slanted composition. In one example, the barrier layer adjacent to the well-conditioning layer may be a slanted composition layer having an Al content increasing towards the well-conditioning layer. The barrier layers and the well layers include AlInGaN or AlGaN.

The plurality of barrier layers and well layers may be formed of AlInGaN or AlGaN. In addition, each of the n-type nitride-based semiconductor layer and the p-type nitride-based semiconductor layer may include an AlInGaN or AlGaN layer.

In accordance with another aspect of the disclosed technology, a UV light emitting diode includes: an active area disposed between an n-type nitride-based semiconductor layer and a p-type nitride-based semiconductor layer, The active area includes barrier layers containing Al and well layers containing Al. The well layers and the barrier layers are disposed over each other in an alternating arrangement. At least one of the barrier layers includes an inclined-composition layer formed between the well layers and having an increasing Al content. Further, a distal end of the inclined-composition layer at a side of the p-type nitride-based semiconductor layer is composed of AlN.

The UV light emitting diode can be implemented in various ways to include one or more of the following features. The design of the distal end of the inclined-composition layer having a composition of AlN can facilitate control of the composition of the well layer. The UV light emitting diode may further include a conditioning layer of a nitride semiconductor formed between the active area and the n-type nitride-based semiconductor layer and adjoining the active area. The conditioning layer adjoining the active area may be formed of GaN or AlN. The nitride semiconductor can include a binary nitride semiconductor. The plurality of well layers may be formed of AlInGaN or AlGaN. In addition, the plurality of barrier layers may include AlInGaN or AlGaN. The conditioning layer can include AlN. The barrier layers and the well layers can be formed of include AlInGaN or AlGaN.

In accordance with a further aspect of the disclosed technology, a method of fabricating a UV light emitting diode including an active area between an n-type nitride-based semiconductor layer and a p-type nitride-based semiconductor layer is provided. The method includes: growing an n-type nitride-based semiconductor layer on a substrate; forming an active area by alternately growing a plurality of barrier layers containing Al and a plurality of well layers containing Al on the n-type nitride-based semiconductor layer; and growing a p-type nitride-based semiconductor layer on the active area. In addition, formation of the active area may include growing a conditioning layer before growing at least one well layer or at least one barrier layer, and the conditioning layer is formed of a binary nitride semiconductor.

Before growing the well layer or the barrier layer, the conditioning layer of the binary nitride semiconductor is grown, whereby the composition of the well layer or the barrier layer grown thereon can be easily controlled.

The conditioning layer may be formed of GaN or AlN. Particularly, AlN has a wider band-gap than the well layer and thus does not absorb light generated from the well layer, thereby reducing light loss.

Formation of the active area may include growing the conditioning layer before growing each of the well layers and the barrier layers.

The plurality of barrier layers and the plurality of well layers may be formed of AlInGaN or AlGaN.

In accordance with yet another aspect of the disclosed technology, a method of fabricating a UV light emitting diode including an active area between an n-type nitride-based semiconductor layer and a p-type nitride-based semiconductor layer is provided. The method includes: growing an n-type nitride-based semiconductor layer on a substrate; forming an active area by alternately growing a plurality of barrier layers containing Al and a plurality of well layers containing Al on the n-type nitride-based semiconductor layer; and growing a p-type nitride-based semiconductor layer on the active area. In addition, among the plurality of barrier layers, at least one barrier layer placed between the well layers may be formed as an inclined-composition layer having an increasing Al content on the well layer, and a distal end of the inclined-composition layer may have a composition of AlN.

The design of the distal end of the inclined-composition layer having a composition of AlN can facilitate control of the composition of the well layer formed thereon.

The plurality of barrier layers and the plurality of well layers may be formed of AlInGaN or AlGaN.

In addition, the method of fabricating a UV light emitting diode may further include forming a conditioning layer of a binary nitride semiconductor before forming the active area. The binary nitride semiconductor may be GaN or AlN.

In various examples of the implementations of the disclosed technology, the conditioning layer is grown before growing the well layer or the barrier layer and thus, the composition of the well layer or the barrier layer grown thereon can be easily or effectively controlled. In addition, by controlling the compositions of the well layers or barrier layers to be uniform, UV light emitting diodes can prevent crystal defects such as cracks.

In another aspect, a UV light emitting diode includes an active area disposed between two different conductive type semiconductor layers. The active area includes barrier layers and well layers that are alternately arranged with each other; and a conditioning layer including a well-conditioning layer adjoining at least one of the well layers and a barrier-conditioning layer adjoining at least one of the barrier layers. The conditioning layer include a binary nitride-based semiconductor layer.

The UV light emitting diode can be implemented in various ways to include one or more of the following features. The conditioning layer can includes GaN or AlN. The barrier layers can include Al. The well layers includes a nitride-based semiconductor. The conditioning layer can have a wider band gap than the well layers. The barrier layers can include an inclined-composition layer. The inclined-composition layer can include an increasing Al content. The inclined-composition layer can include an end including AlN.

In another aspect, a UV light emitting diode is provided to include an active semiconductor structure disposed between two different conductive type semiconductor layers and configured to emit UV light. The active semiconductor structure includes barrier layers and well layers that are alternately arranged relative to one another; and a conditioning layer including a well-conditioning layer adjoining at least one of the well layers and a barrier-conditioning layer adjoining at least one of the barrier layers. Each well-conditioning layer or barrier-conditioning layer includes a binary nitride-based semiconductor layer to provide a better uniform composition than an adjacent well layer or barrier layer to enhance structure quality and operation performance of the active semiconductor structure.

Yet in another aspect of the disclosed technology, a UV light emitting diode is structured to include an active semiconductor structure disposed between an n-type nitride-based semiconductor layer and a p-type nitride-based semiconductor layer and configured to emit UV light. This active semiconductor structure includes a plurality of barrier layers each including Al, a plurality of well layers each including Al, and the well layers and the barrier layers are alternately disposed over each other so that the well layers and barrier layers are spatially interlaced. This active semiconductor structure further includes plurality of conditioning layers disposed relative to the well layers and the barrier layers so that each conditioning layer is adjacent to and in contact with a corresponding well layer or barrier layer to provide a better uniform composition along a lateral direction parallel to each layer than an adjacent well layer or barrier layer to enhance structure quality and operation performance of the active area. In some implementations, a barrier layer may be have an inclined composition which spatially varies along a direction perpendicular to the barrier layer.

BRIEF DESCRIPTION OF DRAWINGS

The above and other aspects, features, and advantages of the technology disclosed in this patent document will become apparent from the detailed description of the following embodiments in conjunction with the accompanying drawings, in which.

DETAILED DESCRIPTION

In fabricating light emitting diodes, it is desirable for the fabricated light emitting diodes to have uniform electrical and optical characteristics. Various implementations of the disclosed technology provide UV light emitting diodes including barrier layers and well layers whose compositions can be easily or effectively controlled. In addition, by controlling the compositions of the well layers or barrier layers to be uniform, the resultant UV light emitting diodes can be free of crystal defects such as cracks for one or more advantages, e.g., enhancing the UV LED production quality, improving the LED production yield, and improving the UV LED operation performance.

L emitting diodes emitting relatively deep UV light include well layers that contain or include Al such as AlGaN. Corresponding barrier layers or contact layers of the Al containing or including well layers contain or include a greater amount of Al than the well layers in order to have a wider band gap than the well layers.

Figure 1:
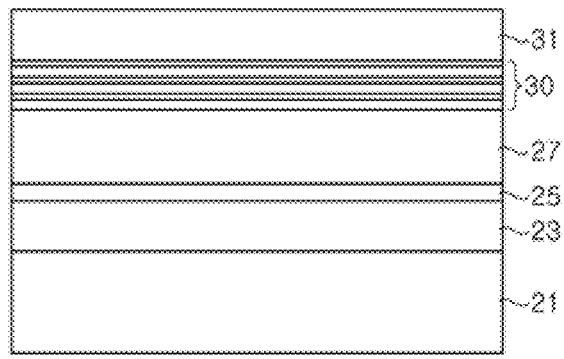
FIG. 1 is a schematic sectional view illustrating an exemplary method of fabricating a typical UV light emitting diode.
Figure 2:
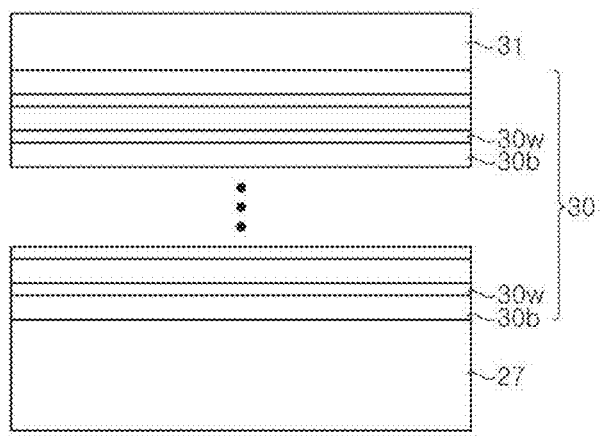
FIG. 2 is an enlarged sectional view of an active area of the UV light emitting diode of FIG. 1.

FIG. 1 is a schematic sectional view illustrating an exemplary method of fabricating a typical UV light emitting diode, and FIG. 2 is an enlarged sectional view of an active area of the UV light emitting diode of FIG. 1.

Referring to FIGS. 1 and 2, a buffer layer 23, an AlN layer 25, an n-type AlGaN layer 27, an active area of a multi-quantum well structure 30, and a p-type AlGaN layer 31 are formed on a substrate 21. The multi-quantum well structure 30 is active in that it converts the applied electrical excitation into UV light emission. An active area is an area that emits UV light.

The substrate 21 is a sapphire substrate and the buffer layer 23 acts as a sacrificial layer for a laser lift-off process and is generally formed of GaN. The buffer layer 23 may include a nucleus layer and a high temperature buffer layer.

A support substrate is attached to an upper side of the p-type AlGaN layer 31 and the substrate 21 is removed by a laser lift-off process. Further, the buffer layer 23 and the AlN layer 25 are also removed to expose a surface of the n-type AlGaN layer 27.

The active area 30 has a multi-quantum well structure in which barrier layers 30b and well layers 30w are alternately positioned relative to one another, e.g., being alternately stacked one above another so that the barrier layers 30b and well layers 30w are spatially interlaced. In the active area 30, the lower most layer and the uppermost layer may be the barrier layers 30b or the well layers 30w.

In one example, the barrier layers 30b and the well layers 30w are formed of Al-containing nitride-based semiconductors, for example, AlGaN or AlInGaN. When the AlGaN layers or the AlInGaN layers are stacked one above another, residual stress in each of the layers causes a more significant band bending phenomenon to occur. This technical issue in Al-containing nitride-based semiconductors is different from fabrication of semiconductor layers of InGaN/GaN structures in other LED designs. At least in part due to this technical issue in Al-containing nitride-based semiconductors contributes, the UV light emitting diode tends to have a reduced internal quantum efficiency and can have a undesired significant variation or shift in the wavelength of emitted light with the spatially increasing current. Moreover, when accurate thickness control fails, a layer formed on the active area 30, for example, the p-type AlGaN layer 31, may have a crack which causes failure of the light emitting diode.

When the barrier layers and the well layers are formed of AlGaN or AlInGaN, the barrier layers or the well layers generally have a very thin thickness in nano-scale. When thin layers are formed of AlGaN or AlInGaN, a composition of a layer to be grown tends to exhibit strong dependency on the composition of a layer formed under such a thin layer. Hence, if the composition of the nitride-based semiconductor layer under the AlGaN layer changes, the AlGaN layer is grown to have a different composition.

Accordingly, it can be difficult to fabricate light emitting diodes having uniform electrical and optical characteristics under run-to-run or wafer-to-wafer conditions. Further, for light emitting diodes that are fabricated in the same wafer, the light emitting diodes are prone to having significant variations in electrical and optical characteristics from one LED to another made from the same wafer.

Examples of implementations of the disclosed technology are described in detail with reference to the accompanying drawings. The disclosed technology is not limited to the specific examples disclosed in this patent document and may also be implemented in different forms. In the drawings, certain properties such as widths, lengths, thicknesses, and the like of elements illustrated may be exaggerated for convenience. Throughout the specification, like reference numerals denote like elements having the same or similar functions.

Figure 3:
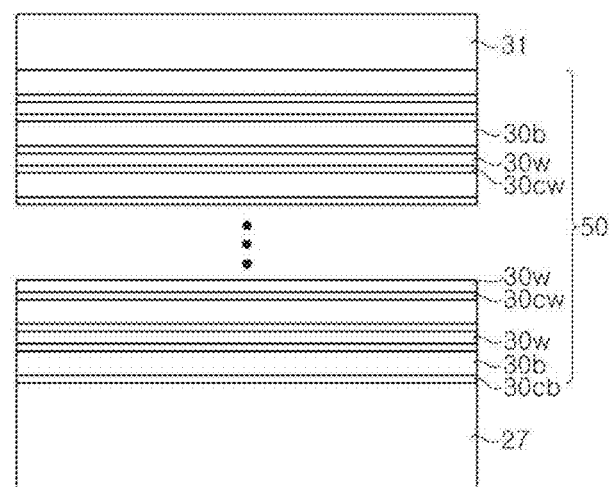
FIG. 3 is an enlarged sectional view of an active area of an exemplary UV light emitting diode according to one embodiment of the disclosed technology.

FIG. 3 is an enlarged sectional view of an active area of an exemplary UV light emitting diode according to one aspect of the disclosed technology.

Referring to FIG. 3, a UV light emitting diode according to one aspect of the invention includes an active area 50 between an n-type nitride-based semiconductor layer 27 and a p-type nitride-based semiconductor layer 31. The UV light emitting diode may include a growth substrate 21 or a support substrate, as shown in FIG. 1.

Each of the n-type nitride-based semiconductor layer 27 and the p-type nitride-based semiconductor layer 27 is formed of or include a nitride-based semiconductor layer having a wider band-gap than the active area 30w. Each of the n-type nitride-based semiconductor layer 27 and the p-type nitride-based semiconductor layer 31 may include an Al-containing layer, for example, an AlInGaN layer or an AlGaN layer.

The active area 50 includes barrier layers 30b, well layers 30w, and conditioning layers 30cb and 30cw. The conditioning layers 30cb and 30cw include a well-conditioning layer 30cw and a barrier-conditioning layer 30cb.

The barrier layers 30b and the well layers 30w are alternately arranged to form a multi-quantum well structure. The well layers 30w are formed of or include a nitride-based semiconductor emitting UV light in a desired wavelength range, for example, in the range of 200 nm to 365 nm. In one embodiment, the well layers 30w may be formed of or include a nitride-based semiconductor emitting UV light in a wavelength range of 250 nm to 340 nm. The well layers 30w contain or including Al and may be formed of or include AlInGaN or AlGaN.

The barrier layers 30b are formed of or include a nitride-based semiconductor having a wider band gap than the well layers 30w. The barrier layers 30b contain or include Al and may be formed of or include AlInGaN or AlGaN. Each of the barrier layers 30b may be formed to have a constant composition, but other implementations are also possible regarding the composition of each barrier layer 30b. At least one barrier layer 30b may have a stack structure of layers having different compositions, and may be or include an inclined-composition layer in which the material composition of the layer spatially varies or changes from one end or surface of the layer to the other end or surface along the direction perpendicular to the layer. In implementing such an inclined-composition layer, the layer material composition is not intended to vary or change spatially in the lateral direction within the layer (i.e., parallel to the layer) and is desirably to have a spatially uniform or constant composition along the lateral direction within the layer to reduce the chance of developing desired cracks. For example, a barrier layer 30b placed between the well layers 30w may be formed as the inclined-composition layer that has a spatially varying composition from one surface of the layer to the opposite surface of the layer.

Each of the conditioning layers 30cb and 30cw is placed or disposed between respective well layer 30w and barrier layer 30b adjacent to or neighboring each conditioning layers 30cb or 30 cw. The well-conditioning layer 30cw adjoins, and in direct contact with, the well layer 30w at a side of the n-type nitride-based semiconductor layer 27. The barrier-conditioning layer 30cb adjoins, and is in direct contact with, the barrier layer 30b at the side of the n-type nitride-based semiconductor layer 27.

The conditioning layers 30cb and 30cw may be formed of or include a binary nitride-based semiconductor layer, for example, GaN or AlN. Since the conditioning layers 30cb and 30cw are binary nitride-based semiconductor layers, this binary nature enables the conditioning layers 30cb and 30cw to inherently have a more uniform composition than a tertiary or quaternary nitride-based semiconductor layer. In one prospective in understanding the disclosed technology, the presence of the conditioning layers 30cb and 30cw with an inherently more uniform composition along the lateral direction within each conditional layer promotes or allows a layer subsequently grown over a conditioning layer to have an improved composition uniformity in a lateral direction of a layer while further providing an isolation layer that isolates any non-uniformity in composition in a well layer to adversely affect the lateral uniformity of the composition of a subsequently grown well layer. In some implementations, the conditioning layers 30cb and 30cw may be formed of AlN which has a wider band-gap than the well layers 30w. Thus, the conditioning layers 30cb and 30cw do not absorb light and reduce light loss.

In implementations where the conditioning layers 30cb and 30cw are formed of AlN, the UV light emitting diode may have a vertical structure. In the vertical structure, the UV light emitting diode may include a support substrate for supporting the nitride-based semiconductor layers 27, 50 and 31. Structures other than the described vertical structure of the UV light emitting diode are possible. For example, the UV light emitting diode may have a lateral structure. In the lateral structure, the UV light emitting diode may include a growth substrate for growing the nitride-based semiconductor layers 27, 50 and 31.

In implementations using the lateral structure with the UV light emitting diode including a growth substrate for growing the nitride-based semiconductor layers 27, 50 and 31, the well-conditioning layers 30cw adjoin the well layers 30c. However, other implementations are also possible. For example, the well-conditioning layer(s) 30cw may be formed to adjoin multiple well layers 30w or a single well layer 30w. In addition, although the barrier-conditioning layers 30cb are illustrated as adjoining the barrier layers 30b, other implementations are also possible. For example, the barrier-conditioning layer(s) 30cb may be formed to adjoin multiple barrier layers 30b or a single barrier layer 30b.

Next, an example of a method of fabricating the UV light emitting diode is described.

First, an n-type nitride-based semiconductor layer 27 is grown on a substrate 21, substantially as shown in FIG. 1. Before growing the n-type nitride-based semiconductor layer 27, semiconductor layers, for example, a buffer layer 23, an AlN layer 25, and the like, may be grown. Before formation of the n-type nitride-based semiconductor layer 27, various layers may be disposed on the substrate 21 as needed and the layers formed or disposed on the substrate 21 may be modified in various ways.

The n-type nitride-based semiconductor layer 27 may be grown by metal organic chemical vapor deposition (MOCVD). The n-type nitride-based semiconductor layer 27 may be composed of a single layer or multiple layers, and include an AlInGaN layer or an AlGaN layer.

An active area 50 is grown on the n-type nitride-based semiconductor layer 27. The active area 50 is formed or disposed over the n-type nitride-based semiconductor layer to include alternate layers of Al-containing barrier layers 30b and Al-containing well layers 30w. Here, a conditioning layer 30cb is formed prior to formation of the barrier layers 30b, and a well-conditioning layer 30cw is formed prior to formation of the well layers 30w. The conditioning layers 30cb and 30cw are formed of or include a binary nitride semiconductor, for example, GaN or AlN.

With the alternating Al-containing barrier layers 30b and Al-containing well layers 30w structure, even when the compositions of layers, for example, the n-type nitride-based semiconductor layer 27 or the well layers 30w, formed under the barrier layers 30b are changed, the barrier layers 30b can be grown on the barrier-conditioning layers 30cb to have a uniform composition. Accordingly, it is possible to achieve easy or effective control of the composition of the barrier layers 30b.

In addition, even when the compositions of layers, for example, the barrier layers 30b, formed under the well layers 30w are changed, the well layers 30w can be grown on the well-conditioning layers 30cw to have a uniform composition. Accordingly, it is possible to achieve easy or effective control of the composition of the well layers 30w.

Next, a p-type nitride-based semiconductor layer 31 is grown on the active area 50. The p-type nitride-based semiconductor layer 31 may be composed of a single layer or multiple layers, and include an AlInGaN layer or an AlGaN layer.

The UV light emitting diode may have a lateral structure or a vertical structure, and a detailed description thereof will be omitted herein.

According to the disclosed technology, the design of the well-conditioning layer 30cw or the barrier-conditioning layer 30cb enables easy or effective control of the compositions of the well layers 30w or the barrier layers 30b. This implementation can render the active area 50 to have a reduced residual stress, thereby reducing the likelihood of having, or preventing, undesired crystal defects such as cracks in the p-type nitride-based semiconductor layer 31 grown on the active area 50. Furthermore, it is possible to achieve uniform control of the compositions of the well layers 30w or the barrier layers 30b. As a result, not only light emitting diodes fabricated in the same wafer but also light emitting diodes fabricated under run-to-run or wafer-to-wafer conditions exhibit improved uniform electrical and optical characteristics.

Figure 4:
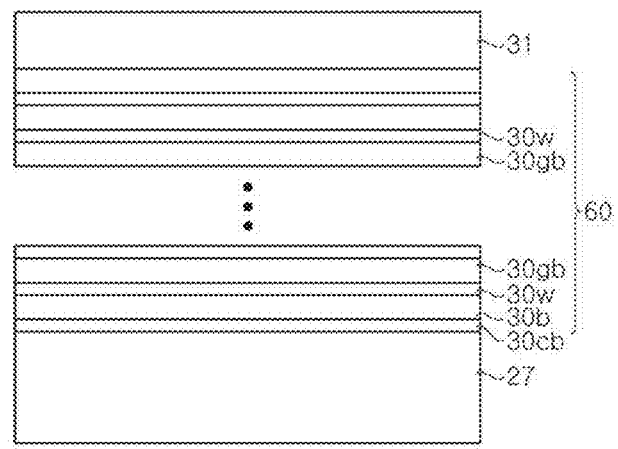
FIG. 4 is an enlarged sectional view of an active area of an exemplary UV light emitting diode according to another embodiment of the disclosed technology.

FIG. 4 is an enlarged sectional view of an active area of an exemplary UV light emitting diode according to another embodiment of the disclosed technology.

Referring to FIG. 4, a UV light emitting diode according to this embodiment includes an active area 60 between an n-type nitride-based semiconductor layer 27 and a p-type nitride-based semiconductor layer 31. The UV light emitting diode may also include a growth substrate 21 or a support substrate as shown in FIG. 1.

The n-type nitride-based semiconductor layer 27, the p-type nitride-based semiconductor layer 27, the growth substrate 21, and the support substrate are the same as those described with reference to FIG. 3, and thus redundant descriptions are omitted.

The active area 60 includes a plurality of barrier layers 30b and 30gb and a plurality of well layers 30w.

The barrier layers 30gb and the well layers 30w are alternately arranged to form a multi-quantum well structure. The well layers 30w are the same as those described with reference to FIG. 3 and a detailed description thereof will be omitted. The barrier layers 30gb are formed of or include a nitride-based semiconductor having a wider band-gap than the well layers 30w. The barrier layers 30gb contain or include Al and may be formed of or include AlInGaN or AlGaN.

Each of the barrier layers 30gb is placed between the well layers 30w, and form an inclined-composition layer having a spatially increasing Al content. A distal end of the inclined-composition layer 30gb at a side of the p-type nitride-based semiconductor layer 31 is composed of or include AlN. The design of the distal end of the inclined-composition layer 30gb composed of or including AlN enables easy or effective control of the composition of the well layer 30w grown thereon.

In some implementations, the active area 60 may further include a barrier layer 30b adjacent to the n-type nitride-based semiconductor layer 27. The barrier layer 30b is the same as the barrier layer 30b described with reference to FIG. 3, and may be or include, for example, a constant composition layer. In this case, a barrier-conditioning layer 30cb may adjoin the barrier layer 30b at a side of the n-type nitride-based semiconductor layer 27. In addition, although not shown in the drawings, a well-conditioning layer 30cw may be placed between the barrier layer 30b and the well layer 30w placed above the barrier layer 30b, as shown in FIG. 3.

In some implementations, the well layer 30w may be placed adjacent to the n-type nitride-based semiconductor layer 27. As a specific example under this design, the well-conditioning layer 30cw (see FIG. 3) may adjoin the well layer 30w at the side of the n-type nitride-based semiconductor layer 27.

In implementations, the UV light emitting diode may have a lateral structure or a vertical structure, as described with reference to FIG. 3.

In some implementations, except for the barrier layer 30b adjacent to the n-type nitride-based semiconductor layer 27, all of the barrier layers 30gb can be composed of or include inclined-composition layers that have spatially varying compositions. However, other implementations are also possible. For example, some barrier layers or a single barrier layer may have an inclined composition which varies spatially and the remaining barrier layers may have a constant composition within each layer. For example, the active area 60 may have a stack structure of layers having different compositions. For another example, the active area 60 may include the conditioning layers 30cw or 30cb together with the barrier layer 30gb, which is the inclined-composition layer.

Next, an exemplary method of fabricating the above structures in UV light emitting diodes is described.

The method of fabricating the UV light emitting diode according to this embodiment is similar to the fabrication method described with reference to FIG. 3, except for the active area 60, and thus only differences in the methods are described in detail.

After the n-type nitride-based semiconductor layer 27 is grown on the substrate 21, the active area 60 is grown on the n-type nitride-based semiconductor layer 27. The active area 60 is formed by alternately growing Al-containing barrier layers 30b and 30gb and Al-containing well layers 30w. The barrier layer 30b may be omitted. The plurality of well layers 30w may be formed of or include AlInGaN or AlGaN.

The barrier layers 30b and 30gb may be formed of or include AlInGaN or AlGaN. In addition, among the barrier layers 30b and 30gb, each of the barrier layers 30gb placed between the well layers 30w may form an inclined-composition layer placed on the well layer 30w and having an increasing Al content that spatially increases the content or concentration of Al, and a distal end of the inclined-composition layer 30w is composed of or include AlN. For example, the growth of the barrier layer 30gb may be finished to have a composition of AlN by spatially increasing the Al content in the well layer 30w while spatially decreasing the content of Ga or In. The formation of the inclined-composition layer having a composition of AlN can reduce the residual stress in the active area 60. In addition, the design of the distal end of the inclined-composition layer having a composition of AlN can facilitate control of the composition of the well layer 30w formed on the barrier layer 30gb.

In implementing the design of the barrier layers 30gb having an inclined composition, it is possible to achieve uniform control of the composition of the well layers 30w. As a result, not only light emitting diodes fabricated on the same wafer but also light emitting diodes fabricated under run-to-run or wafer-to-wafer conditions exhibit uniform electrical and optical characteristics.

Figure 5A:
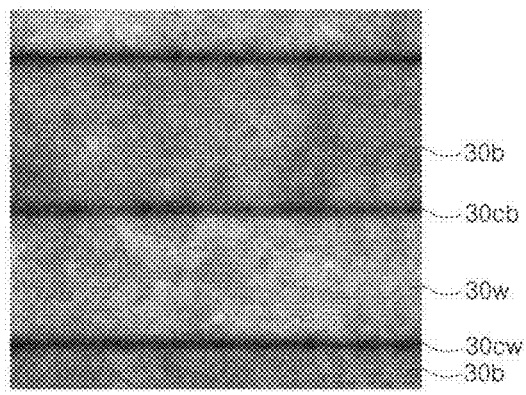
FIG. 5(a) and FIG. 5(b) are cross-sectional TEM micrographs of samples prepared according to the embodiments of FIG. 3 and FIG. 4, respectively.
Figure 5B:
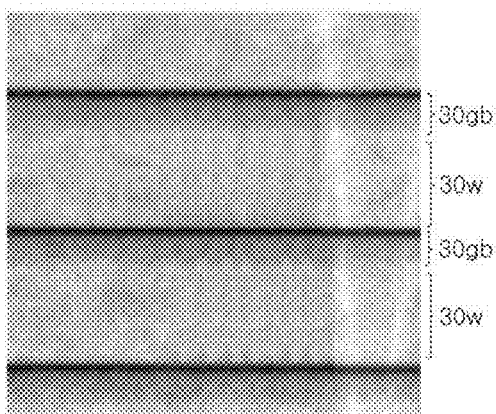

FIG. 5(a) and FIG. 5(b) are cross-sectional TEM micrographs of samples prepared according to the embodiments of FIG. 3 and FIG. 4, respectively.

Referring to FIG. 5(a), each of the well layer 30w and the barrier layer 30b can be formed of or include AlGaN. Since the barrier layer 30b contains or includes a higher amount of Al than the well layer 30w, the barrier layer 30b exhibits a deeper gray color than the well layer 30w. On the other hand, conditioning layers 30cw and 30cb can be formed between the barrier layer 30b and the well layer 30w. The conditioning layers 30cw and 30cb can include a well-conditioning layer 30cw and a barrier-conditioning layer 30cb. These conditioning layers 30cw and 30cb can be composed of or include AlN.

Referring to FIG. 5(b), the well layer 30w is formed of or include AlGaN and the barrier layer 30b is an inclined-composition layer. A distal end of the barrier layer 30b is composed of or include AlN and thus has a black color in the TEM micrograph. The distal end of the barrier layer 30b has a composition of AlN, which is formed by increasing the Al content from the composition of the well layer 30w. After reaching the composition of AlN, the growth of the barrier may be continued, thereby providing an AlN layer with a desired constant thickness.

Figure 6A:
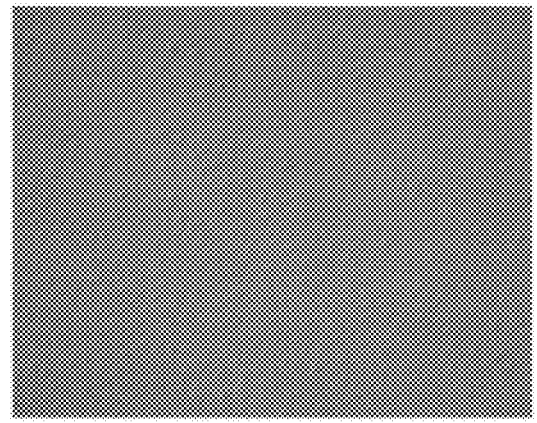
FIG. 6(a) and FIG. 6(b) are plan optical micrographs of test samples adopting a conditioning layer or an inclined-composition layer.
Figure 6B:
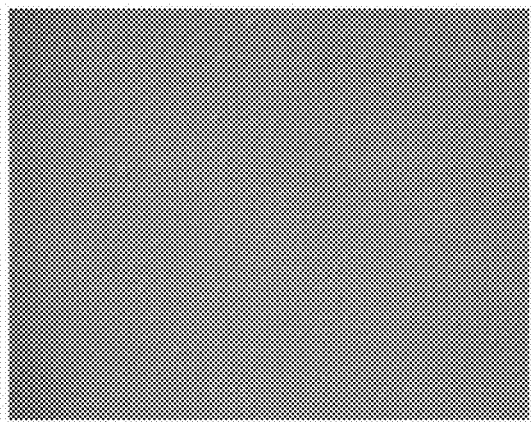

FIG. 6(a) and FIG. 6(b) are plan optical micrographs of test samples adopting a conditioning layer or an inclined-composition layer.

As part of the development of the above disclosed technology, test samples were prepared to confirm influence of a conditioning layer or an inclined-composition layer on stress in a multi-quantum well structure. Thus, doped layers such as an n-type nitride semiconductor layer or a p-type nitride semiconductor were not formed in the test samples.

To prepare the test sample of FIG. 6(a), a GaN buffer layer was grown on a sapphire substrate, followed by alternately growing AlGaN layers having a higher Al content and AlGaN layers having a lower Al content to form a structure as shown in FIG. 5(a), and finally growing an AlGaN layer having a thickness of 0.1 μm. In addition, AlN layers were formed as conditioning layers before growing the AlGaN layers having a higher Al content and the AlGaN layers having a lower Al content.

The test sample of FIG. 6(b) was prepared in the same manner as in the preparation of the test sample of FIG. 6(a), except that AlGaN layers having a higher Al content were formed as the inclined-composition layers, as shown in FIG. 5(b). In addition, the distal end of the inclined-composition layer was formed to have a composition of AlN, instead of forming the AlN layer as the conditioning layer.

As can be seen from FIG. 6(a) and FIG. 6(b), no cracks were observed from the test samples which adopted the conditioning layer or the inclined-composition layer having a composition of AlN at the distal end of the inclined-composition layer.

Figure 7A:
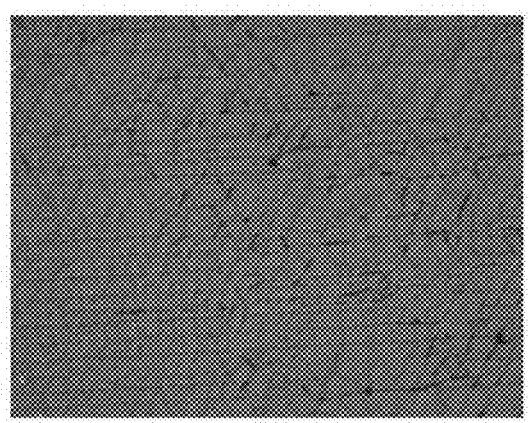
FIG. 7(a) and FIG. 7(b) are plan micrographs of test samples prepared by a technique without using the disclosed technology.
Figure 7B:
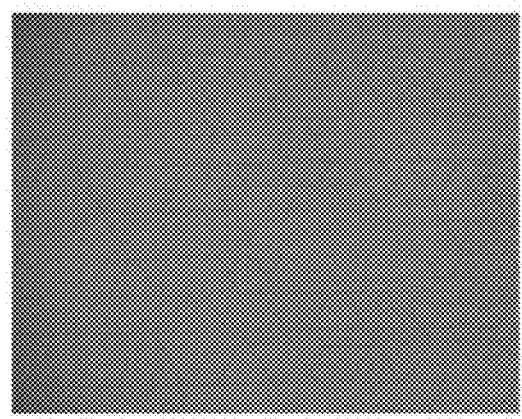

FIG. 7(a) and FIG. 7(b) are plan micrographs of some of the test samples that were prepared a fabrication process that did not implement the disclosed technology in this document.

The test sample of FIG. 7(a) was prepared in the same manner as in the preparation of the test sample of FIG. 6(a) except that the conditioning layer was not formed. The test sample of FIG. 7(a) was prepared in the same manner as in the preparation of the test sample of FIG. 6(a) except that the last composition of the inclined-composition layer was AlGaN instead of AlN.

As revealed by FIG. 7(a) and FIG. 7(b), a number of cracks were observed in the uppermost layer of each of the test samples prepared by a fabrication process that did not implement the disclosed technology in this document. The test sample of FIG. 7(b) including the inclined-composition layer exhibited an improved surface morphology as compared with the test sample of FIG. 7(a), but still had a number of cracks.

Based on the conducted tests, when the multi-quantum well structure is formed without using the disclosed technology in this document, a number of cracks are generated in the p-type nitride-based semiconductor layer on the multi-quantum well structure due to stress in the multi-quantum well structure. In contrast, when the conditioning layer or the inclined-composition layer having a composition of AlN at the distal end of the inclined-composition layer is formed based on the disclosed technology, it is possible to reduce stress in the multi-quantum well structure.

As a result, it is possible to prevent cracks from being formed in the p-type nitride-based semiconductor layer.

Figure 8:
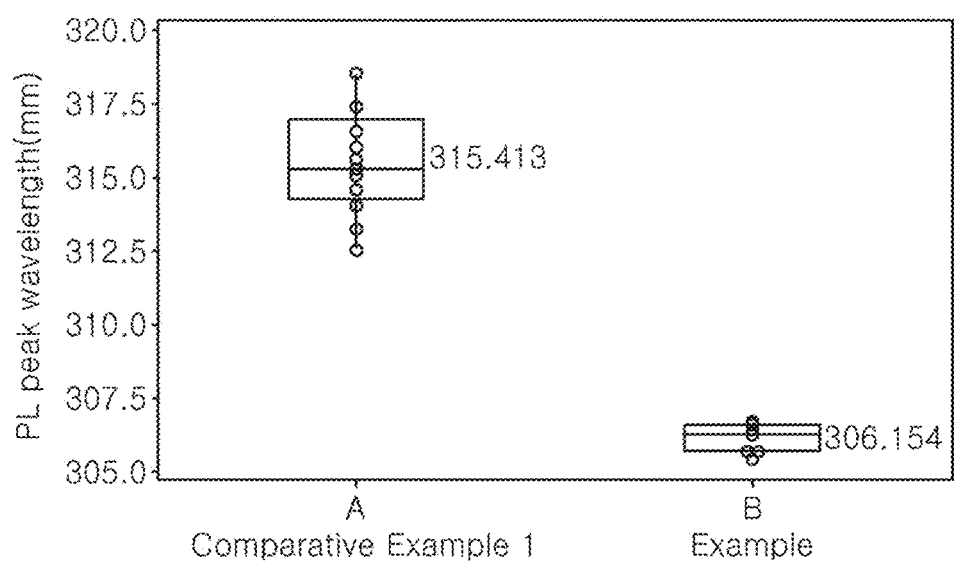
FIG. 8 is a graph depicting a photo-luminescence wavelength distribution of wafer groups prepared by a technique without using the disclosed technology and a wafer group prepared based on the disclosed technology.

FIG. 8 is a graph depicting a photo-luminescence (PL) wavelength distribution of wafer groups prepared by a technique without using the disclosed technology and a wafer group prepared based on the disclosed technology.

In each of Comparative Example 1 and Example, with 30 sapphire substrates loaded in the same chamber for metal organic chemical vapor deposition (MOCVD), epitaxial layers were grown at the same time under the same conditions. In Example, wafers were prepared by forming well-conditioning layers and barrier-conditioning layers before growth of well layers and barrier layers, as described with reference to FIG. 3, and in Comparative Example 1, wafers were prepared by a technique without forming the conditioning layers. Except for the conditioning layers, each of layers formed in Example was grown under the same conditions as those for growing each of layers in Comparative Example.

Referring to FIG. 8, although the well layers were grown under the same conditions in Comparative Example 1 and Example, the wafers of Example exhibited shorter peak wavelengths than the wafers of Comparative Example 1. In addition, the wafers of Example exhibited a smaller deviation than the wafers of Comparative Example 1. These results were obtained due to a more uniform and higher Al content in the well layers by adopting the AlN conditioning layer.

Figure 9:
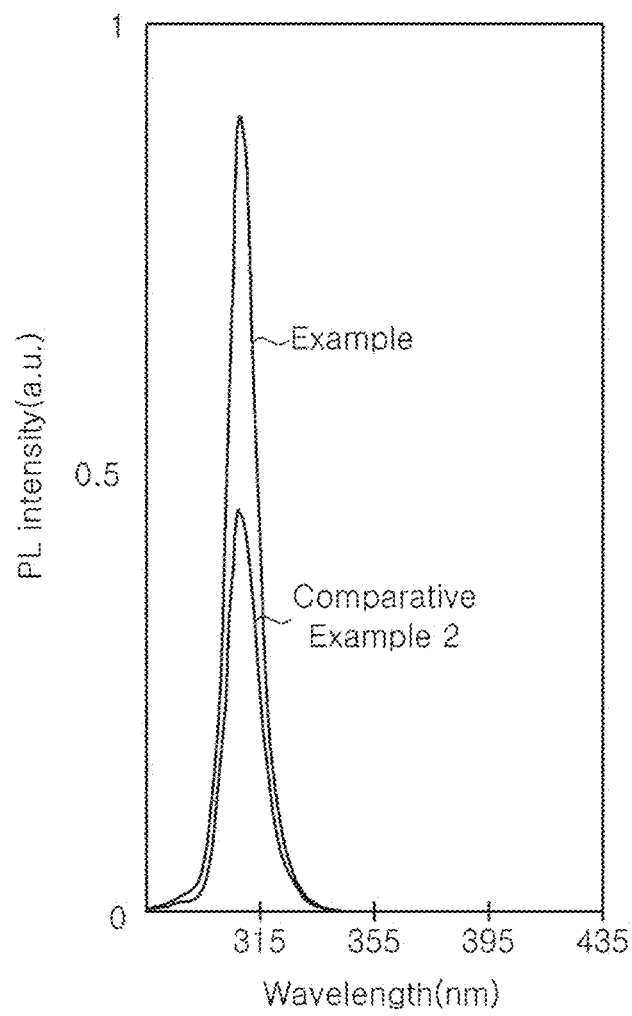
FIG. 9 is a graph depicting PL intensity of a wafer prepared by a technique without using the disclosed technology and a wafer prepared based on the disclosed technology.

FIG. 9 is a graph depicting PL intensity of a wafer prepared by a technique without using the disclosed technology and a wafer prepared based on the disclosed technology.

In FIG. 9, a wafer of Example was selected from the wafer group prepared in Example of FIG. 8, and a wafer of Comparative Example 2 was prepared by adjusting the compositions of the well layers and the barrier layers to have a similar peak wavelength to those of Example.

FIG. 9 shows that the wafer of Example had a higher PL intensity than the wafer of Comparative Example 2. The PL intensity of the wafer of Example was about two times higher than that of the wafer of Comparative Example 2.

Although some embodiments and examples of the disclosed technology have been described above, the disclosed technology is not limited by the disclosed embodiments and examples, and can be implemented in various ways.

What is claimed is:

1. A UV light emitting diode, comprising:
   an active area disposed between an n-type nitride-based semiconductor layer and a p-type nitride-based semiconductor layer,
   the active area comprising:
   a plurality of barrier layers containing Al;
   a plurality of well layers containing Al, wherein the well layers and the barrier layers are disposed over each other in an alternating arrangement; and
   a conditioning layer disposed between one of the well layers and one of the barrier layers, wherein the conditioning layer comprises a well-conditioning layer and a barrier-conditioning layer that are respectively formed at both surfaces of the one of the barrier layers and include Al, to reduce a stress of the active area or improve uniform composition of the active area;
   wherein the conditioning layer includes a nitride semiconductor including AlN.

2. The UV light emitting diode according to claim 1, wherein the conditioning layer includes a binary nitride semiconductor.

3. The UV light emitting diode according to claim 1, wherein the conditioning layer comprises a well-conditioning layer adjoining the corresponding one of the well layers at a side of the n-type nitride-based semiconductor layer.

4. The UV light emitting diode according to claim 3, wherein the corresponding one of the barrier layers adjoining the well-conditioning layer is an inclined-composition layer having an Al content increasing towards the well-conditioning layer.

5. The UV light emitting diode according to claim 1, wherein the barrier-conditioning layer adjoins the corresponding one of the barrier layers at a side of the n-type nitride-based semiconductor layer.

6. The UV light emitting diode according to claim 1, wherein the plurality of barrier layers and the plurality of well layers include AlInGaN or AlGaN.

7. A UV light emitting diode comprising:
an active area disposed between an n-type nitride-based semiconductor layer and a p-type nitride-based semiconductor layer,
the active area comprising:
a plurality of barrier layers containing Al; and
a plurality of well layers containing Al, wherein the well layers and the barrier layers are disposed in an alternating arrangement that well layers and barrier layers alternate relative to each other,
wherein at least one of the barrier layers comprises an inclined-composition layer formed between the well layers and having an increasing Al content along a growth direction of the inclined-composition layer,
wherein a distal end of the inclined-composition layer at a side of the p-type nitride-based semiconductor layer includes AlN.

8. The UV light emitting diode according to claim 7, wherein the active area further comprises:
a conditioning layer of a nitride semiconductor disposed between the active area and the n-type nitride-based semiconductor layer.

9. The UV light emitting diode according to claim 8, wherein the nitride semiconductor includes a binary nitride semiconductor.

10. The UV light emitting diode according to claim 8, wherein the conditioning layer includes AlN.

11. The UV light emitting diode according to claim 7, wherein the plurality of barrier layers and the plurality of well layers include AlInGaN or AlGaN.

12. A UV light emitting diode including:
an active semiconductor structure disposed between two different conductive type semiconductor layers and configured to emit UV light,
the active semiconductor structure including:
barrier layers and well layers that are alternately arranged relative to one another; and
a conditioning layer including a well-conditioning layer adjoining at least one of the well layers and a barrier-conditioning layer adjoining at least one of the barrier layers,
wherein each well-conditioning layer or barrier-conditioning layer includes a binary nitride-based semiconductor layer to provide a better uniform composition than an adjacent well layer or barrier layer to enhance structure quality and operation performance of the active semiconductor structure;
wherein the conditioning layer includes AlN.

13. The UV light emitting diode according to claim 12, wherein the barrier layers include Al.

14. The UV light emitting diode according to claim 12, wherein the well layers include a nitride-based semiconductor.

15. The UV light emitting diode according to claim 12, wherein the conditioning layer has a wider band gap than the well layers.

16. The UV light emitting diode according to claim 12, wherein the barrier layers includes an inclined-composition layer that spatially varies from one surface of the inclined-composition layer to the other surface.

17. The UV light emitting diode according to claim 16, wherein the inclined-composition layer includes an increasing Al content.

18. The UV light emitting diode according to claim 16, wherein the inclined-composition layer includes an end including AlN.

* * * * *